(12) United States Patent
Zhang et al.

(10) Patent No.: US 9,847,706 B2
(45) Date of Patent: Dec. 19, 2017

(54) SYSTEMS AND METHODS FOR REDUCING VOLTAGE RINGING IN A POWER CONVERTER

(71) Applicant: Cirrus Logic, Inc., Austin, TX (US)

(72) Inventors: Lingli Zhang, Austin, TX (US); Dan Shen, Austin, TX (US); Johann Gaboriau, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 820 days.

(21) Appl. No.: 13/829,945

(22) Filed: Mar. 14, 2013

(65) Prior Publication Data

US 2014/0266109 A1    Sep. 18, 2014

(51) Int. Cl.
*H02M 1/15* (2006.01)
*H02M 3/158* (2006.01)
*H03K 17/16* (2006.01)

(52) U.S. Cl.
CPC ........... *H02M 1/15* (2013.01); *H02M 3/1588* (2013.01); *H03K 17/162* (2013.01); *H03K 2217/0063* (2013.01); *Y02B 70/1466* (2013.01)

(58) Field of Classification Search
CPC .... H02M 3/156; H02M 3/1563; H02M 3/157; H02M 3/158; H02M 3/02; H02M 3/04; H02M 3/10; H02M 3/145; H02M 3/155; H02M 3/1582; H02M 3/1588; H02M 1/14; H02M 1/143; H02M 1/146; H02M 1/15; H02M 2001/0012; H02M 2001/0029; H02M 2001/0045; H02M 2003/1552; H02M 2003/1555; H02M 2003/1566; H03K 19/09448; H03K 19/00353; H03K 19/00361; H03K 19/018521; H03K 19/00315; H03K 17/16; H03K 17/161; H03K 17/162; H03K 17/163; H03K 17/164; H03K 17/165; H03K 2217/0063; Y02B 70/00; Y02B 70/14; Y02B 70/1458; Y02B 70/1466

(Continued)

(56) References Cited

U.S. PATENT DOCUMENTS 4,096,398 A    6/1978 Khaitan
4,829,199 A    5/1989 Prater
(Continued)

OTHER PUBLICATIONS

"Switching device" and "diode" definitions, The New IEEE Standard Dictionary of Electrical and Electronics Terms, 5th Ed., p. 352 and p. 1320 (1993).

*Primary Examiner* — Timothy J Dole
*Assistant Examiner* — Carlos Rivera-Perez
(74) *Attorney, Agent, or Firm* — Jackson Walker L.L.P.

(57) ABSTRACT

In accordance with embodiments of the present disclosure, systems and methods may include an input configured to indicate a switching node voltage of a switching node of a power converter comprising a first switch device coupled at its non-gate terminals between a ground voltage and the switching node and a second switch device coupled at its non-gate terminals between an output supply node and the switching node. The systems and methods may also include a predriver circuit coupled to the input and a gate terminal of the first switch device, the predriver circuit configured to drive an input voltage signal to the gate terminal of the first switch device and configured to select an effective impedance of the gate terminal of the first switch device based on the input.

16 Claims, 3 Drawing Sheets

(58) Field of Classification Search
USPC ........ 323/222–226, 271–276, 282–290, 351; 363/24, 39, 127; 330/264, 298; 326/26–28, 82–92; 327/108–112, 170, 327/393, 308–310
See application file for complete search history.

(56) References Cited

U.S. PATENT DOCUMENTS

| | | | |
|---|---|---|---|
| 4,855,623 A | 8/1989 | Flaherty | |
| 5,121,000 A | 6/1992 | Naghshineh | |
| 5,180,936 A | 1/1993 | McDonald | |
| 5,237,213 A | 8/1993 | Tanoi | |
| 5,450,019 A | 9/1995 | McClure et al. | |
| 5,877,647 A * | 3/1999 | Vajapey et al. | 327/391 |
| 6,018,256 A | 1/2000 | Kumagai et al. | |
| 6,137,322 A | 10/2000 | Ten Eyck | |
| 6,265,915 B1 | 7/2001 | Rider et al. | |
| 6,366,129 B1 | 4/2002 | Douglas, III et al. | |
| 6,373,300 B2 | 4/2002 | Welch et al. | |
| 6,429,632 B1 * | 8/2002 | Forbes | H02M 3/07 323/282 |
| 6,985,015 B2 | 1/2006 | Ajit | |
| 7,190,225 B2 | 3/2007 | Edwards | |
| 7,215,152 B2 | 5/2007 | Dubey | |
| 7,649,414 B2 | 1/2010 | Kaya et al. | |
| 7,746,155 B2 | 6/2010 | Labbe | |
| 7,973,523 B2 | 7/2011 | Cheng | |
| 8,085,081 B2 | 12/2011 | Ogawa et al. | |
| 8,184,831 B2 | 5/2012 | Lin | |
| 8,779,731 B2 * | 7/2014 | Menegoli | H02M 3/156 323/222 |
| 8,872,561 B2 * | 10/2014 | Shen et al. | 327/170 |
| 2010/0067152 A1 | 3/2010 | Nakahashi et al. | |
| 2010/0164590 A1 | 7/2010 | Tsuji et al. | |
| 2010/0244930 A1 | 9/2010 | Ogawa et al. | |
| 2012/0014025 A1 | 1/2012 | Sato et al. | |
| 2012/0268091 A1 * | 10/2012 | Takemae | 323/272 |

* cited by examiner

SYSTEMS AND METHODS FOR REDUCING VOLTAGE RINGING IN A POWER CONVERTER

FIELD OF DISCLOSURE

The present disclosure generally relates to integrated circuits, and, more particularly, to systems and methods for reducing voltage ringing in a power converter of an electronic circuit.

BACKGROUND

Many electronic devices on the market today often use power converters to convert electric energy from one form to another (e.g., converting between alternating current and direct current), converting a voltage or current of an electrical signal, modifying a frequency of an electrical signal, or some combination of the above. Examples of power converters may include boost converters and buck converters. Such power converters are often used to convert an input voltage for other circuitry, wherein such converted voltage is greater than (e.g., if a boost converter is used) or less than (e.g., if a buck converter is used) than the input voltage. FIG. 1 illustrates an example circuit 100 comprising a boost converter 102 for converting an input source voltage $V_{BAT}$ to produce a supply voltage $V_{SUPPLY}$ for a switched output stage 104 of an amplifier (e.g., an audio amplifier), as is known in the art. In FIG. 1, boost converter 102 comprises an inductor 106 coupled at a first terminal to an input source voltage $V_{BAT}$ and coupled at a second terminal to non-gate terminals of each of switches 108 and 110. Boost converter 102 shown in FIG. 1 also comprises a switch 108 (e.g., an n-type metal-oxide-semiconductor field effect transistor) coupled at one non-gate terminal to a ground voltage and coupled at its other non-gate terminal to inductor 106 and a non-gate terminal of switch 110, and a switch 110 (e.g., a p-type metal-oxide-semiconductor field effect transistor) coupled at one non-gate terminal to inductor 106 and a non-gate terminal of switch 108 and coupled at its other non-gate terminal to a terminal of capacitor 107. Boost converter 102 shown in FIG. 1 also includes a capacitor 107 coupled between a non-gate terminal of switch 110 and a ground voltage. Predriver circuit 116 may receive an input control voltage $v_{CTRL}$ (typically a pulse-width-modulated input voltage signal) and apply control logic and/or buffering to such input voltage to drive a positive-polarity control voltage $v_{CTRLP}$ to the gate terminal of switch 110 and to drive a negative-polarity control voltage $v_{CTRLN}$ to the gate terminal of switch 108, wherein $v_{CTRLP}$ and $v_{CTRLN}$ are each a function of $v_{CTRL}$. In steady-state operation, switch 108 will generally be open when switch 110 is closed, and vice versa. When switch 108 is closed, current may flow from the voltage source generating the input source voltage $V_{BAT}$ through inductor 106, and inductor 106 may store energy. During this time, inductor 106 may have a voltage drop across it, with a positive-polarity at the terminal coupled to the input source voltage $V_{BAT}$. When switch 108 is open and switch 110 is closed, the current flowing through inductor 106 may be reduced. Such change or reduction in current may be opposed by inductor 106 and the voltage polarity of inductor 106 may reverse (e.g., with a positive-polarity at the terminal coupled to generating the input source voltage $V_{BAT}$). As a result, effectively two voltage sources are in series (input source voltage $V_{BAT}$ and the voltage across inductor 106) thus causing a voltage higher than $V_{BAT}$ to charge capacitor 107. If switches 108 and 110 are cycled fast enough, inductor 106 will not discharge fully in between charging stages, and the supply voltage $V_{SUPPLY}$ on capacitor 107 will have voltage greater than that of the input source voltage $V_{BAT}$ when switch 108 is opened. Thus, the supply voltage $V_{SUPPLY}$ generated by boost converter 102 will be a function of input control voltage $V_{CTRL}$ (e.g., the switching rate and/or duty cycle of a pulse-modulated signal) and the input source voltage $V_{BAT}$.

Switched output stage 104 comprises two complementary legs, each leg comprising a pull-up device 112 (e.g., a switch, a p-type metal-oxide-semiconductor field effect transistor, etc.) coupled at its non-gate terminals between a supply voltage and an output node and a pull-down device 114 (e.g., a switch, an n-type metal-oxide-semiconductor field effect transistor, etc.) coupled at its non-gate terminals between a ground voltage and the output node. An amplifier predriver circuit 118 may receive an input voltage $v_{IN}$ (typically a pulse-width-modulated input voltage signal) and apply control logic and/or buffering to such input voltage to generate a positive-polarity input voltage $V_{IN+}$ to be applied to the gate terminals of the pull-up device 112a and pull-down device 114a of a first leg and a negative-polarity input voltage $V_{IN-}$ to be applied to the gate terminals of the pull-up device 112b and pull-down device 114b of the other leg. Accordingly, switched output stage 104 generates a differential output voltage signal $v_{OUT}$ to its output node which is a function of $v_{IN}$ and $V_{SUPPLY}$.

One disadvantage of boost converters is that the output voltage $V_{SUPPLY}$ of the boost converter may be susceptible to overshoot and ringing, which may ultimately affect the output voltage signal (e.g., $v_{OUT}$) of a switched output stage to which the supply voltage is supplied. Such overshoot and subsequent ringing often occurs as a result of parasitic capacitances and inductances in the circuit resonating at their characteristic frequency, which decays over time due to resistances present in the circuit. For example, referring to FIG. 1, as switching node voltage $v_{SW}$ transitions between its maximum and minimum voltages, $v_{SW}$ may first overshoot such maximum or minimum voltages by an overshoot amplitude, and then oscillate about such maximum or minimum voltage as the ringing decays. Such overshoot and ringing may couple through switch 110, and thus may cause ringing on the supply voltage $V_{SUPPLY}$ which may in turn cause noise or distortion on the output voltage signal $v_{OUT}$.

Traditional approaches to reduction of overshoot and ringing of the output voltage $V_{SUPPLY}$ of a boost converter include increasing the rise and fall times of the negative-polarity control voltage $v_{CTRLN}$. However, such approaches are not without disadvantages, as increasing rise and fall times places constraints on timing parameters (e.g., minimum duty cycle) associated with boost converter 102. FIG. 2 illustrates example voltage and timing graphs associated with boost converter 102 illustrated in FIG. 1, as is known in the art. As shown in FIG. 2, during a rising-edge transition of switching node voltage $v_{SW}$, negative-polarity control voltage $v_{CTRLN}$ may decrease from its maximum voltage (e.g., a supply voltage) to a plateau voltage during a time period $t_1$, and then remain at such plateau voltage during a period of time $t_2$, before falling to zero. Also as shown in FIG. 2, $v_{SW}$ may transition from zero to its maximum voltage during time $t_2$. Those of ordinary skill in the art may recognize that a long time period $t_1$ places constraints on timing parameters (e.g., minimum duty cycle) associated with boost converter 102 and thus can negatively affect timing efficiency and power efficiency while not significantly improving electromagnetic interference. Conversely, long time period $t_2$ will likely show reduced electromagnetic interference, overshoot, and ringing than a shorter time period $t_2$. However, assuming a constant weak pull down strength from the gate terminal of switch 108 during each time period $t_1$ and $t_2$, any beneficial increase in time period $t_2$ results in an undesired increase in time period $t_1$.

Similarly, as also shown in FIG. 2, negative-polarity control voltage $v_{CTRLN}$ may increase from a ground voltage to a plateau voltage, and then remain at such plateau voltage during a period of time $t_2'$, before rising to its maximum voltage during a period of time $t_1'$. Also as shown in FIG. 2, $v_{SW}$ may transition from a maximum voltage to a ground voltage during time $t_2'$. Those of ordinary skill in the art may recognize that a long time period $t_1'$ places constraints on timing parameters (e.g., minimum duty cycle) associated with boost converter and thus can negatively affect timing efficiency and power efficiency while not significantly improving electromagnetic interference. Conversely, long time period $t_2'$ will likely show reduced electromagnetic interference, overshoot, and ringing than a shorter time period $t_2'$.

SUMMARY

In accordance with the teachings of the present disclosure, certain disadvantages and problems associated with output signal integrity of a power converter have been reduced or eliminated.

In accordance with embodiments of the present disclosure, an apparatus may include an input configured to indicate a switching node voltage of a switching node of a power converter comprising a first switch device coupled at its non-gate terminals between a ground voltage and the switching node and a second switch device coupled at its non-gate terminals between an output supply node and the switching node. The apparatus may also include a predriver circuit coupled to the input and a gate terminal of the first switch device, the predriver circuit configured to drive an input voltage signal to the gate terminal of the first switch device and configured to select an effective impedance of the gate terminal of the first switch device based on the input.

In accordance with these and other embodiments of the present disclosure, a method may include receiving an input configured to indicate a switching node voltage of a switching node of a power converter comprising a first switch device coupled at its non-gate terminals between a ground voltage and the switching node and a second switch device coupled at its non-gate terminals between an output supply node and the switching node. The method may also include selecting an effective impedance of a gate terminal of the first switch device based on the input.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 3:
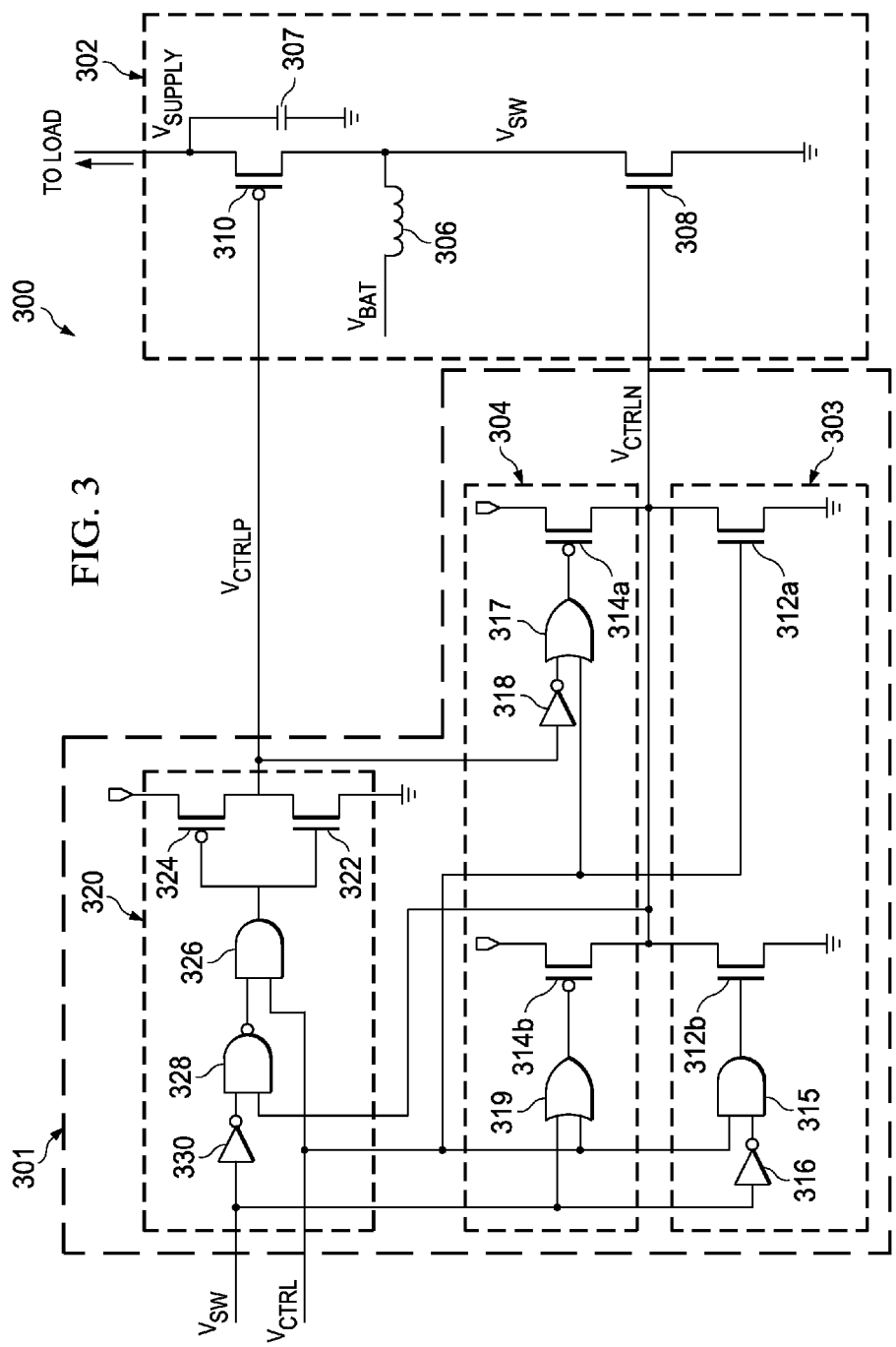
FIG. 3 illustrates an example circuit comprising a boost converter and a predriver for converting an input source voltage to produce a supply voltage in accordance with embodiments of the present disclosure.

FIG. 3 illustrates an example circuit 300 comprising a boost converter 302 for converting an input source voltage $V_{BAT}$ to produce a supply voltage $V_{SUPPLY}$, in accordance with embodiments of the present disclosure. As shown in FIG. 3, circuit 300 may comprise a boost converter 302 and a predriver circuit 301.

Boost converter 302 may comprise any system, device, or apparatus configured to convert a direct current input source voltage $V_{BAT}$ to generate a supply voltage $V_{SUPPLY}$ wherein the conversion is based on a control voltage $v_{CTRL}$ or a derivative thereof. As shown in FIG. 3, boost converter 302 may include an inductor 306, a switch 308 (implemented as an n-type metal-oxide-semiconductor field effect transistor in the embodiments represented by FIG. 3), a switch 310 (implemented as a p-type metal-oxide-semiconductor field effect transistor in the embodiments represented by FIG. 3), and a capacitor 307. Inductor 306 may be coupled at a first terminal to the input source voltage $V_{BAT}$ and coupled at a second terminal to non-gate terminals of each of switches 308 and 310. Switch 308 may be coupled at one non-gate terminal to a ground voltage and coupled at its other non-gate terminal to inductor 306 and a non-gate terminal of switch 310. Switch 310 may be coupled at one non-gate terminal to inductor 306 and a non-gate terminal of switch 308 and coupled to a terminal of capacitor 307. Capacitor 307 may be coupled between a ground voltage and a non-gate terminal of switch 310. The various components of boost converter 302 may be configured such that switch 308 is generally open when switch 310 is closed, and vice versa. When switch 308 is closed, current may flow from the voltage source generating the input source voltage $V_{BAT}$ through inductor 306, and inductor 306 may store energy. During this time, inductor 306 may have a voltage drop across it, with a positive-polarity at the terminal coupled to generating the input source voltage $V_{BAT}$. When switch 308 is open and switch 310 is closed, the current flowing through inductor 306 may be reduced. Such change or reduction in current may be opposed by inductor 306 and the voltage polarity of inductor 306 may reverse (e.g., with a positive-polarity at the terminal coupled to generating the input source voltage $V_{BAT}$). As a result, effectively two voltage sources are in series (input source voltage $V_{BAT}$ and the voltage across inductor 306) thus causing a voltage higher than $V_{BAT}$ to charge capacitor 307, thus generating supply voltage $V_{SUPPLY}$ on capacitor 307. The supply voltage $V_{SUPPLY}$ generated by boost converter 302 may be a function of input control voltages $v_{CTRLP}$ and $v_{CTRLN}$ controlling switches 308 and 310 (e.g., the switching rate and/or duty cycle of a pulse-modulated signal) and the input source voltage $V_{BAT}$.

Predriver circuit 301 may comprise any system, device, or apparatus configured to receive an input control voltage $v_{CTRL}$ (e.g., a pulse-width-modulated voltage signal) and apply control logic and/or buffering to such input voltage to drive positive-polarity control voltage $v_{CTRLP}$ to the gate terminal of switch 310 and to drive a negative-polarity control voltage $v_{CTRLN}$ to the gate terminal of switch 308, wherein $v_{CTRLP}$ and $v_{CTRLN}$ are each a function of $v_{CTRL}$. Based on respective input voltage signals $v_{CTRLP}$ and $v_{CTRLN}$, boost converter 302 may generate a supply voltage $V_{SUPPLY}$ which is a function of the respective input control signals $v_{CTRLP}$ and $v_{CTRLN}$.

Figure 1:
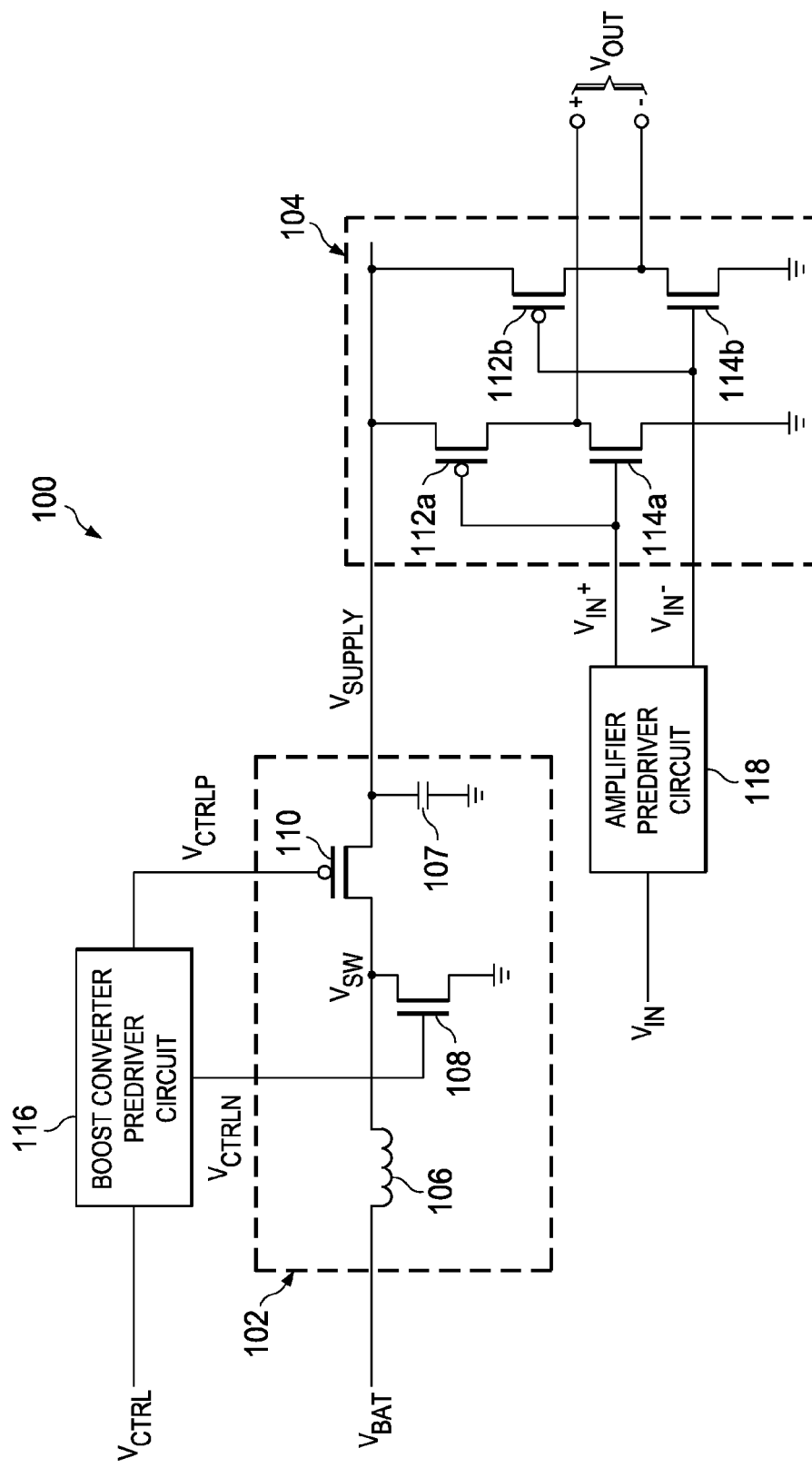
FIG. 1 illustrates an example circuit comprising a boost converter for converting an input source voltage to produce a supply voltage for a switched output stage of an amplifier, as is known in the art.
Figure 2:
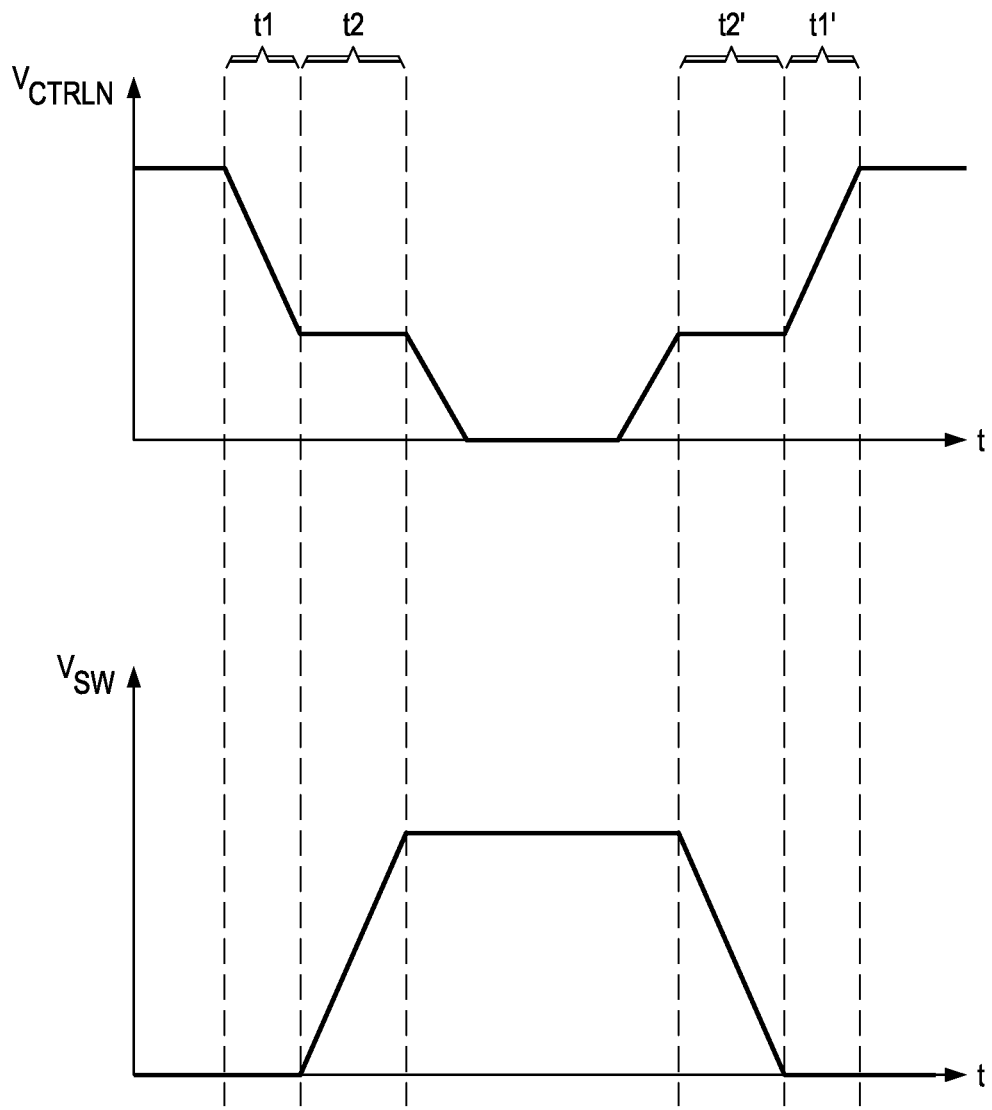
FIG. 2 illustrates example voltage and timing graphs associated with the boost converter illustrated in FIG. 1, as is known in the art.

As shown in FIG. 3, predriver circuit 301 may include a rising-edge negative-polarity portion 303, a falling-edge negative-polarity portion 304, and a positive-polarity portion 320. Rising-edge negative-polarity portion 303 may comprise pull-down device 312a (implemented as an n-type metal-oxide-semiconductor field effect transistor in the embodiments represented by FIG. 3), pull-down device 312b (implemented as an n-type metal-oxide-semiconductor field effect transistor in the embodiments represented by FIG. 3), logic AND gate 315, and logic inverter 316. Pull-down device 312a may be coupled at its non-gate terminals between a ground voltage and the node for negative-polarity control voltage $v_{CTRLN}$ and may be driven at its gate terminal by input control voltage $v_{CTRL}$. Pull-down device 312b may be coupled at its non-gate terminals between a ground voltage and the node for negative-polarity control voltage $v_{CTRLN}$ and may be driven at its gate terminal by the output terminal of logic AND gate 315. Logic AND gate 315 may in turn be driven at one of its input terminals by input control voltage $v_{CTRL}$ and driven at its other input terminal by the output terminal of logic inverter 316. Logic inverter 316 may be driven at its input terminal by the switching node voltage $v_{SW}$ present at the node in which inductor 306, switch 308, and switch 310 are coupled to each other. Pull-down device 312b may be configured such that when enabled, it has a greater drive strength (e.g., a greater size) than pull-down device 312a. Thus, when the switching node voltage $v_{SW}$ transitions from the ground voltage to its maximum voltage, negative-polarity control voltage $v_{CTRLN}$ may be driven by both pull-down device 312a and pull-down device 312b, which may quickly pull down negative-polarity control voltage $v_{CTRLN}$ from its maximum voltage to a plateau voltage (e.g., corresponding to time period $t_1$ depicted in FIG. 2), at which point pull-down device 312b may turn off in response to $v_{SW}$ transitioning to a higher voltage, and pull-down device 312a may then slowly pull down negative-polarity control voltage $v_{CTRLN}$ from the plateau voltage to the ground voltage (FIG. 2 depicts the time period $t_2$ in which $v_{CTRLN}$ is at the plateau voltage, during which $V_{sw}$ transitions to its maximum voltage).

Accordingly, rising-edge negative-polarity portion 303 may ensure a switching transition of negative-polarity control voltage $v_{CTRLN}$ in order to maintain a desired level of timing and/or power efficiency (e.g., by quickly pulling down negative-polarity control voltage $v_{CTRLN}$ from its maximum voltage to the plateau voltage) while also controlling the falling edge of negative-polarity control voltage $v_{CTRLN}$ to reduce or eliminate its tendency to cause overshoot or ringing on the switching node voltage $v_{SW}$ (e.g., by slowly pulling down negative-polarity control voltage $v_{CTRLN}$ from the plateau voltage to the ground voltage relative to the rate at which rising-edge negative-polarity portion 303 pulls down negative-polarity control voltage $v_{CTRLN}$ from its maximum voltage to the plateau voltage). Thus, based on an input indicating the switching node voltage $v_{SW}$, rising-edge negative-polarity portion 303 may select a drive strength of a pull-down circuit, thus selecting an effective impedance for the gate terminal of switch 308 which is based on the drive strength, such that rising-edge negative-polarity portion 303 is configured to decrease the drive strength as the switching node voltage $v_{SW}$ increases from the ground voltage to an output voltage (e.g., maximum voltage).

Falling-edge negative-polarity portion 304 may comprise pull-up device 314a (implemented as a p-type metal-oxide-semiconductor field effect transistor in the embodiments represented by FIG. 3), pull-up device 314b (implemented as a p-type metal-oxide-semiconductor field effect transistor in the embodiments represented by FIG. 3), logic OR gate 317, logic inverter 318, and logic OR gate 319. Pull-up device 314a may be coupled at its non-gate terminals between a supply voltage and the node for negative-polarity control voltage $v_{CTRLN}$ and may be driven at its gate terminal by logic OR gate 317. Logic OR gate 317 may be driven at one of its input terminals by input control voltage $v_{CTRL}$ and driven at its other input terminal by the output terminal of logic inverter 318. Logic inverter 318 may be driven at its input terminal by the positive-polarity control voltage $v_{CTRLP}$. Pull-up device 314b may be coupled at its non-gate terminals between a supply voltage and the node for negative-polarity control voltage $v_{CTRLN}$ and may be driven at its gate terminal by the output terminal of logic OR gate 319. Logic OR gate 319 may in turn be driven at one of its input terminals by input control voltage $v_{CTRL}$ and driven at its other input terminal by the switching node voltage $v_{SW}$. Pull-up device 314b may be configured such that when enabled, it has a greater drive strength (e.g., a greater size) than pull-up device 314a. Thus, when the switching node voltage $v_{SW}$ transitions from its maximum voltage to the ground voltage, the negative-polarity control voltage $v_{CTRLN}$ may first be driven by pull-up device 314a to be at or near a plateau voltage (e.g., corresponding to time period $t_2'$ depicted in FIG. 2). Once the switching node voltage $v_{SW}$ transitions to a level below a predetermined threshold voltage, pull-up device 314b may turn on, quickly driving the negative-polarity control voltage $v_{CTRLN}$ to the supply voltage (e.g., corresponding to time period $t_1'$ depicted in FIG. 2).

Accordingly, falling-edge negative-polarity portion 304 may ensure a fast switching transition of negative-polarity control voltage $v_{CTRLN}$ in order to maintain a desired level of timing and/or power efficiency (e.g., by quickly pulling up negative-polarity control voltage $v_{CTRLN}$ from the plateau voltage to its maximum voltage) while also controlling the rising edge of negative-polarity control voltage $v_{CTRLN}$ to reduce or eliminate its tendency to cause overshoot or ringing on the switching node voltage $v_{SW}$ (e.g., by slowly pulling up negative-polarity control voltage $v_{CTRLN}$ from the ground voltage to the plateau voltage and maintaining the plateau voltage relative to the rate at which falling-edge negative-polarity portion 304 pulls up negative-polarity control voltage $v_{CTRLN}$ from the plateau voltage to its maximum voltage). Thus, based on an input indicating the switching node voltage $v_{SW}$, falling-edge negative-polarity portion 304 may select a drive strength of a pull-up circuit, thus selecting an effective impedance for the gate terminal of switch 308 which is based on the drive strength, such that falling-edge negative-polarity portion 304 is configured to increase the drive strength as the switching node voltage $v_{SW}$ decreases from its maximum voltage to the ground voltage.

Positive-polarity portion 320 may comprise pull-down device 322 (implemented as an n-type metal-oxide-semiconductor field effect transistor in the embodiments represented by FIG. 3), pull-up device 324 (implemented as a p-type metal-oxide-semiconductor field effect transistor in the embodiments represented by FIG. 3), logic AND gate 326, logic NAND gate 328, and logic inverter 330. Pull-down device 322 may be coupled at its non-gate terminals between a ground voltage and the node for positive-polarity control voltage $v_{CTRLP}$ and may be driven at its gate terminal by logic AND gate 326. Pull-up device 324 may be coupled at its non-gate terminals between a supply voltage and the node for positive-polarity control voltage $v_{CTRLP}$ and may also be driven at its gate terminal by logic AND gate 326. Logic AND gate 326 may be driven at one of its input terminals by input control voltage $v_{CTRL}$ and driven at its other input terminal by the output terminal of logic NAND gate 328. Logic NAND gate 328 may be driven at one of its input terminals by the negative-polarity control voltage $v_{CTRLN}$ and driven at its other input terminal by logic inverter 330. Logic inverter 330 may be driven at its input terminal by the switching node voltage $v_{SW}$. When the switching node voltage $v_{SW}$ transitions from the ground voltage to its maximum voltage, the positive-polarity control voltage $v_{CTRLP}$ may be driven to the ground voltage in response to the negative-polarity control voltage $v_{CTRLN}$ falling and/or the switching node voltage $v_{SW}$ rising, thus ensuring smooth transition between switch 308 and switch 310 and therefore, reducing the output voltage ringing of boost converter 302.

Accordingly, positive-polarity portion 320 may further improve the edge control functionality of falling-edge negative-polarity portion 304. In particular, as input control voltage $v_{CTRL}$ decreases from its maximum voltage to the ground voltage, it may cause pull-up device 324 of positive-polarity portion 320 to pull up the positive-polarity control voltage $v_{CTRLP}$ to the supply voltage, in turn enabling pull-up device 314a of falling-edge negative-polarity portion 304, thus beginning the transition of negative-polarity control voltage $v_{CTRLN}$ from the ground voltage to the plateau voltage.

As used herein, when two or more elements are referred to as "coupled" to one another, such term indicates that such two or more elements are in electronic communication whether connected indirectly or directly, without or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosures have been described in detail, it should be understood that various changes, substitutions, and alterations could be made hereto without departing from the spirit and scope of the disclosure.

What is claimed is:

1. An apparatus, comprising:
an input configured to indicate a switching node voltage of a switching node of a power converter comprising a first switch device coupled at its non-gate terminals between a ground voltage and the switching node and a second switch device coupled at its non-gate terminals between an output supply node and the switching node; and
a predriver circuit coupled to the input and a gate terminal of the first switch device, the predriver circuit configured to drive an input voltage signal to the gate terminal of the first switch device and configured to select an effective impedance of the gate terminal of the first switch device based on the input.

2. The apparatus of claim 1, wherein:
the predriver circuit comprises a pull-down circuit configured to drive the gate terminal of the first switch device to the ground voltage;
the predriver circuit is configured to select a drive strength of the pull-down circuit based on the input; and
the effective impedance is based on the drive strength.

3. The apparatus of claim 2, wherein the predriver circuit is configured to decrease the drive strength as the switching node voltage increases from the ground voltage to an output voltage.

4. The apparatus of claim 1, wherein:
the predriver circuit comprises a pull-up circuit configured to drive the gate terminal of the first switch device to a supply voltage;
the predriver circuit is configured to select a drive strength of the pull-up circuit based on the input; and
the effective impedance is based on the drive strength.

5. The apparatus of claim 4, wherein the predriver circuit is configured to increase the drive strength as the switching node voltage decreases from an output voltage to the ground voltage.

6. The apparatus of claim 1, wherein the first switch device comprises an n-type metal-oxide-semiconductor field effect transistor.

7. The apparatus of claim 1, wherein the second switch device comprises one of a p-type metal-oxide-semiconductor field effect transistor and an n-type metal-oxide-semiconductor field effect transistor.

8. The apparatus of claim 1, wherein the power converter comprises a boost converter.

9. A method, comprising:
receiving an input configured to indicate a switching node voltage of a switching node of a power converter comprising a first switch device coupled at its non-gate terminals between a ground voltage and the switching node and a second switch device coupled at its non-gate terminals between an output supply node and the switching node; and
selecting an effective impedance of a gate terminal of the first switch device based on the input.

10. The method of claim 9, wherein selecting the effective impedance comprises selecting a drive strength of a pull-down circuit based on the input, wherein:
the pull-down circuit is configured to drive the gate terminal of the first switch device to the ground voltage; and
the effective impedance is based on the drive strength.

11. The method of claim 10, wherein selecting the drive strength comprises decreasing the drive strength as the switching node voltage increases from the ground voltage to an output voltage.

12. The method of claim 9, wherein selecting the effective impedance comprises selecting a drive strength of a pull-up circuit based on the input, wherein:
   the pull-up circuit is configured to drive the gate terminal of the first switch device to the supply voltage; and
   the effective impedance is based on the drive strength.

13. The method of claim 12, wherein selecting the drive strength comprises deer-easing increasing the drive strength as the switching node voltage decreases from an output voltage to the ground voltage.

14. The method of claim 9, wherein the first switch device comprises an n-type metal-oxide-semiconductor field effect transistor.

15. The method of claim 9, wherein the second switch device comprises one of a p-type metal-oxide-semiconductor field effect transistor and an n-type metal-oxide-semiconductor field effect transistor.

16. The method of claim 9, wherein the power converter comprises a boost converter.

\* \* \* \* \*

UNITED STATES PATENT AND TRADEMARK OFFICE
CERTIFICATE OF CORRECTION

PATENT NO. : 9,847,706 B2
APPLICATION NO. : 13/829945
DATED : December 19, 2017
INVENTOR(S) : Zhang et al.

It is certified that error appears in the above-identified patent and that said Letters Patent is hereby corrected as shown below:

In the Claims

In Column 9, Lines 11-14, please amend Claim 13, as follows:
13. The method of Claim 12, wherein selecting the drive strength comprises [[deer-easing]] increasing the drive strength as the switching node voltage decreases from the output voltage to the ground voltage.

Signed and Sealed this
Thirteenth Day of February, 2018

Andrei Iancu
*Director of the United States Patent and Trademark Office*